(12) United States Patent
Laake et al.

(10) Patent No.: US 6,986,087 B2
(45) Date of Patent: Jan. 10, 2006

(54) METHOD AND APPARATUS FOR IMPROVING TESTABILITY OF I/O DRIVER/RECEIVERS

(75) Inventors: Kevin Laake, Fort Collins, CO (US); Navin Ghisiawan, Ft. Collins, CO (US); Barry J. Arnold, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 312 days.

(21) Appl. No.: 10/238,570

(22) Filed: Sep. 9, 2002

(65) Prior Publication Data
US 2004/0049721 A1    Mar. 11, 2004

(51) Int. Cl.
*G11R 31/28*    (2006.01)

(52) U.S. Cl. .................................. 714/724; 714/738
(58) Field of Classification Search ................ 714/724, 714/738, 733; 324/763, 764, 765
See application file for complete search history.

(56) References Cited

U.S. PATENT DOCUMENTS

| | | | |
|---|---|---|---|
| 5,225,774 A * | 7/1993 | Imamura | 324/158.1 |
| 5,621,739 A | 4/1997 | Sine | |
| 6,009,026 A * | 12/1999 | Tamlyn et al. | 365/201 |
| 6,125,464 A * | 9/2000 | Jin | 714/727 |
| 6,195,775 B1 * | 2/2001 | Douskey et al. | 714/727 |
| 6,348,811 B1 | 2/2002 | Haycock | |
| 6,477,674 B1 * | 11/2002 | Bates et al. | 714/738 |
| 6,598,066 B1 * | 7/2003 | Ott | 707/710 |
| 6,629,274 B1 | 9/2003 | Tripp | |
| 6,639,426 B2 | 10/2003 | Haycock | |
| 6,898,741 B2 * | 5/2005 | Muljono et al. | 714/700 |

* cited by examiner

*Primary Examiner*—Phung My Chung
(74) *Attorney, Agent, or Firm*—John Pessetto

(57) ABSTRACT

An embodiment of this invention provides a circuit and method for improving the testability of I/O driver/receivers. First, two separate I/O driver/receiver pads are electrically connected. A bit pattern generator in one of the I/O driver/receivers drives a bit pattern through a driver to the connected pads. The bit pattern is then driven through the receiver of a second I/O driver/receiver to a first clocked register. An identical bit pattern generator in the second I/O driver/receiver then drives an identical bit pattern into a second clocked register. A comparator compares the outputs of these two registers. If the two bit patterns don't match, the comparator signals there is a functional problem with one of the I/O driver/receivers.

5 Claims, 3 Drawing Sheets

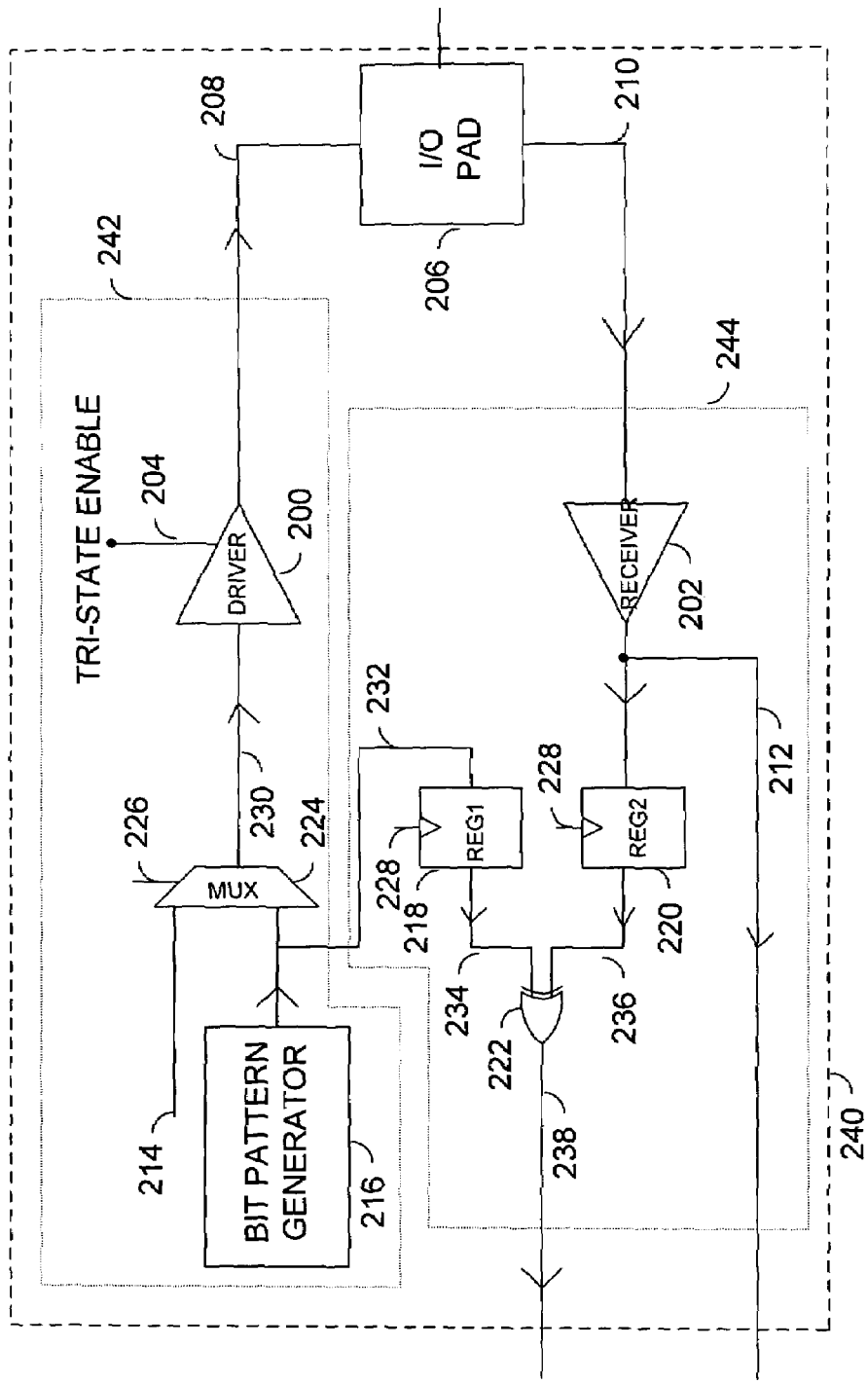
FIGURE 2 (AMENDED)

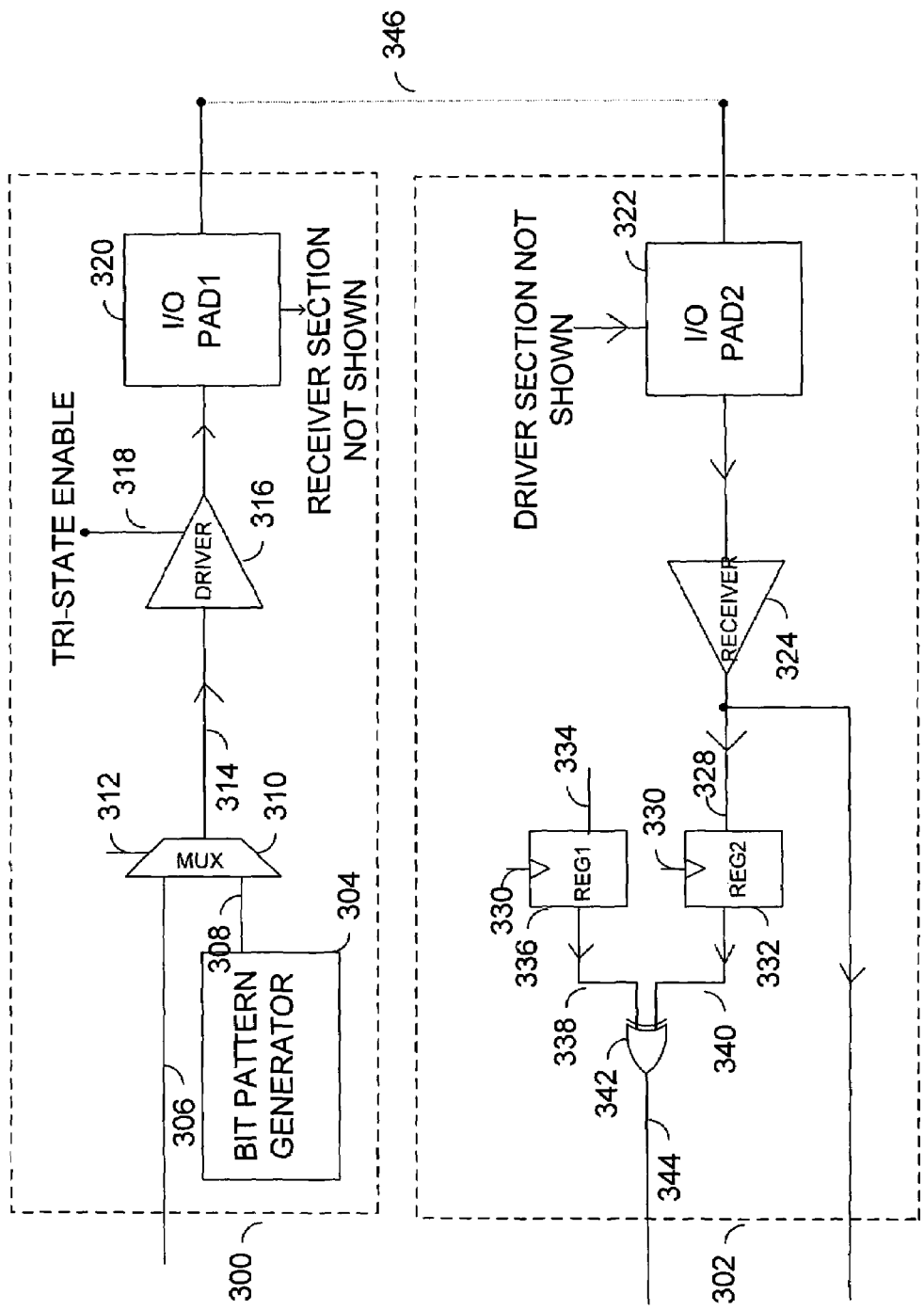
FIGURE 3 (AMENDED)

METHOD AND APPARATUS FOR
IMPROVING TESTABILITY OF I/O
DRIVER/RECEIVERS

FIELD OF THE INVENTION

This invention relates generally to electronic circuits. More particularly, this invention relates to integrated electronic circuits and testing I/O driver/receivers.

BACKGROUND OF THE INVENTION

Very Large Scale Integrated (VLSI) chips may contain millions of transistors and electrical connections. Because VLSI chips may be so complex, a great deal of testing may be required to verify that a particular chip is fully functional. Observation of signals internal to modern chip designs can be extremely difficult due to the small size of the features on the chip. Some features on modern chips may be as small as 1 millionth of a meter. These small features can make it very difficult to "probe" an actual electrical node on a VLSI chip. Methods used to probe internal nodes on a VLSI chip include micro probing and e-beam probing. Either of these methods is time consuming and may require various layers of the chip to be physically removed.

Another method used to observe the value or state of an electrical node is to include "scan chain" circuitry along with the normal circuits. A scan chain may include many memory elements that can store electrical values of many nodes of the normal circuitry. These stored values may then be "clocked" from one scan chain memory element to another and then to one or more output pads on a chip. The values presented on the output pads may then be driven to an external tester that may then evaluate the stored electrical values. In order to scan the electrical values captured in the scan chain, the normal operation of the chip must be stopped. Starting and stopping the normal operation of the chip and scanning the state of many electrical nodes may take a great deal of time.

Another method that may be used to test and debug the functionality of a VLSI chip is to use "broadside vectors." A test program evaluates the function of the VLSI chip and from that evaluation, the program produces a set of signals or "vectors" that may be applied to a VLSI chip. For each set of signals the test program produces to be applied to the VLSI chip, there is another set of signals or vectors that should appear on the outputs of a VLSI chip. An external tester measures the set of outputs that appear on a VLSI chip and determines if these outputs match the values predicted by the test program. By generating many "broadside" vectors, part of the functionality of the VLSI chip may be determined. This method may require a great deal of computer time to create the vectors as well as a great deal of time to actually apply the vectors to the chip.

Scanned vector testing and broadside vector testing both require external test equipment to provide electrical test input to a chip and observe electrical output from a chip. The cost of equipment used to test chips and the cost of facilities to house this equipment can be extremely high. If the amount of external testing required to test a VLSI chip can be reduced, the cost of manufacturing VLSI chips may be reduced.

There is a need in the art to be able to test circuitry on a VLSI chip with a minimal number of external signals. One embodiment of this invention allows the circuitry of I/O (Input/Output) driver/receivers to be tested with very few external signals. This embodiment includes a specific bit pattern generator in the driver section of I/O driver/receiver, which creates a bit pattern that may be recognized by circuitry placed in the receiver section of another I/O driver/receiver, when the I/O driver/receivers are functioning properly. A detailed description of one embodiment of this invention is described later.

SUMMARY OF THE INVENTION

An embodiment of this invention provides a circuit and method for improving the testability of I/O driver/receivers. First, two separate I/O driver/receiver pads are electrically connected. A bit pattern generator in one of the I/O driver/receivers drives a bit pattern through a driver to the connected pads. The bit pattern is then driven through the receiver of a second I/O driver/receiver to a first clocked register. An identical bit pattern generator in the second I/O driver/receiver then drives an identical bit pattern into a second clocked register. A comparator compares the outputs of these two registers. If the two bit patterns don't match, the comparator signals there is a functional problem with one or both of the I/O driver/receivers.

Other aspects and advantages of the present invention will become apparent from the following detailed description, taken in conjunction with the accompanying drawing, illustrating by way of example the principles of the invention.

BRIEF DESCRIPTION OF THE DRAWINGS

FIG. 2 is a schematic drawing of an I/O driver/receiver circuit with additional circuitry used to test functionality of I/O driver/receivers.

FIG. 3 is schematic drawing illustrating how two separate I/O driver/receivers may be used to test functionality of I/O driver/receivers.

DETAILED DESCRIPTION OF THE PREFERRED EMBODIMENT

Figure 1:
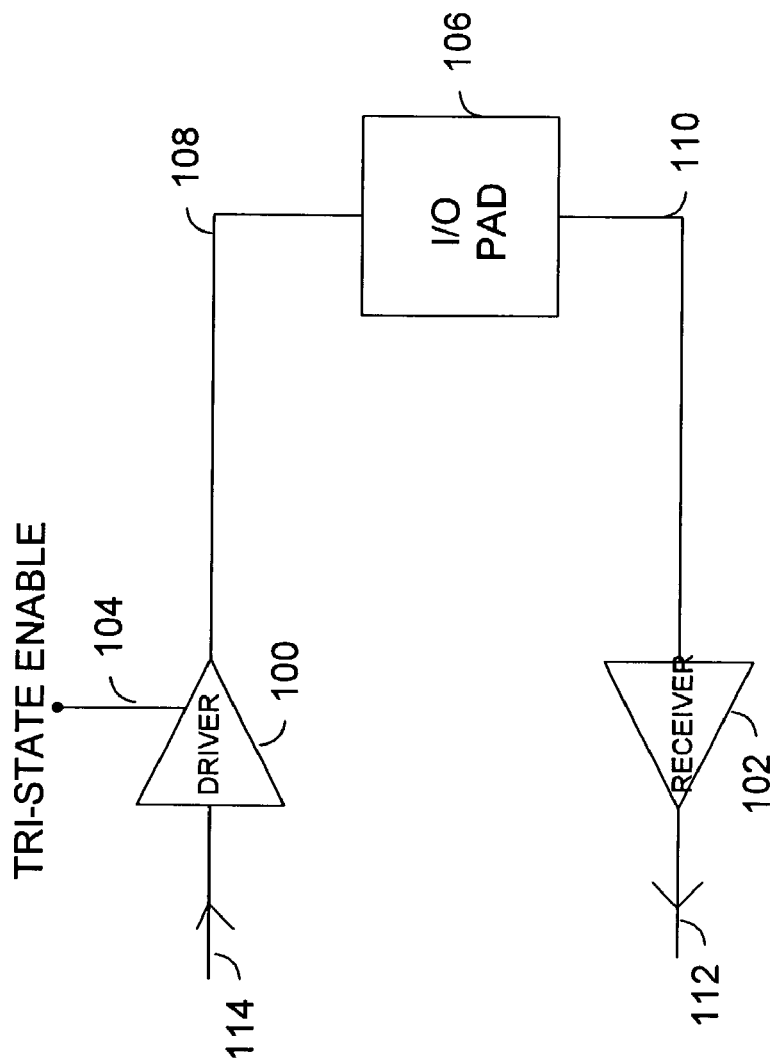
FIG. 1 is a schematic drawing of an I/O driver/receiver circuit. Prior Art

FIG. 1 is a schematic drawing of a typical I/O driver/receiver. Data from a chip may be driven to the input, 114, of the driver, 100. If the tri-state enable signal, 104, is not enabled, the data presented on the input, 114, of the driver, 100 will be driven through the receiver, 100, to the I/O pad, 106 and then off the chip to another device.

In order for data to be driven into a chip from the I/O pad, 106, the tri-state enable signal, 104 must be enabled. Enabling the tri-state enable signal, 104, stops the driver, 100 from driving and presents a high impedance to any source driving node 108. When a signal is driven on to the I/O pad, 106, the signal is presented at the input, 110, of the receiver, 102. The receiver 102, then drives the signal from its input, 110, to its output, 112, to a point internal to a chip. The I/O pad, 106, may be used as an input or an output depending on the situation. Instead of using two pads to create an input and an output, one pad may be used as an input and as an output.

FIG. 2 is a schematic drawing of one embodiment of an I/O driver/receiver with additional circuitry to enable testing of I/O driver/receivers. A bit pattern generator, 216, generates a bit pattern that drives an input, 232, of a MUX, 224 and the input, 232, of a clocked register, 228. When the driver section, 242, is used to drive a bit pattern to another I/O driver/receiver, the control signal, 226, of the MUX, 224, allows the bit pattern from the bit pattern generator, 216, to pass into the input, 230, of the driver, 200. When the driver section, 242, is used to drive a bit-pattern to another I/O driver/receiver, the tri-state enable signal, 204, is disabled, and the driver, 200, drives the bit pattern to the I/O pad, 206, and then to another I/O driver/receiver.

In normal operation, data from circuitry internal to a chip, 214, is allowed to pass through MUX, 224, when control signal, 226, allows it. In normal operation, data passes through the MUX, 224, and is then driven by the driver, 200, when the tri-state enable signal, 204, is disabled. The driver 200, then drives the data to I/O pad, 206, and from I/O pad, 206, to other circuitry off chip.

The receiver section, 244, may be used to compare a bit pattern driven from another I/O driver/receiver. A bit pattern from another I/O driver/receiver may be driven to the I/O pad, 206, and from the I/O pad, 206 into the input, 210, of the receiver, 202. The output, 212, of the receiver, 202, drives data into the internal circuitry of a chip and into the input of a clocked register, REG2, 220. The bit pattern generator, 216, in addition to driving a bit pattern into the MUX, 224, drives data into the input of clocked register, REG1, 218. Because the bit pattern generator, 216, and the bit pattern generators in all other I/O driver/receivers are identical, the bit pattern driven through clocked register, REG2, 220, and clocked register, REG1, 218 may be compared.

The bit patterns driven through clocked registers REG1, 218, and REG2, 220 may be synchronized by applying a clock signal, 228 to each of the registers, REG1, 218, and REG2, 220. After synchronizing the two bit patterns, the two bit patterns may be compared by a comparator. In this example, the comparator is a XOR logic gate, 222. One bit pattern is send to an input, 234, of the XOR logic gate, 222, and the other bit pattern is send to an input, 236, of the XOR logic gate, 222. If the two bit patterns are identical, the output, 238, outputs all "zeros". When all zeros are output from the XOR logic gate, 222, it indicates that the driver section, 242, of a I/O driver/receiver and the receiver section, 244, of another I/O driver/receiver may be functional. If, however, the output, 238, of the XOR logic gate, 222, outputs any "ones", it may indicate that either the driver section, 242, of one I/O driver/receiver or the receiver section, 244, of another I/O driver/receiver may be functioning improperly. In addition, if any ones are output from XOR logic gate, 222, it may indicate that both the receiver section, 244, of one I/O driver/receiver and the driver section, 242, of another I/O driver/receiver may not be functioning properly.

FIG. 3 illustrates how two I/O driver/receivers, 300 and 302 may be used to test the functionality of the driver section of I/O driver/receiver, 300, and the receiver section of I/O driver/receiver, 302. First, I/O pad1, 320, and I/O pad2, 322 are electrically connected, 346. The control signal, 312, is set to allow a bit pattern from bit pattern generator, 304, to pass through MUX, 310, into the input, 314 of driver, 316. The tri-state enable signal, 318 is disabled and the bit pattern on the input, 314, of driver, 316, is driven to I/O pad1, 320 and to I/O pad2, 322.

The bit pattern generated by the bit pattern generator, 304, in I/O driver/receiver, 300, is now presented at the input of the receiver, 324, of I/O driver/receiver, 302. The receiver, 324, drives the input, 328, of REG2, 332 and the circuitry internal to a chip. The bit pattern from the bit pattern generator in I/O driver/receiver, 302, is presented at the input, 334, of REG2, 336. The outputs, 338 and 340, of REG1, 336 and REG2, 332, respectively, are synchronized by clock signal, 330. The output, 338, of REG1, 336 and the output, 340, of REG2, 332 are input to a two-input XOR gate, 342.

If the two bit patterns input to the XOR gate, 342, match, the output, 344, should be all "zeros." This may indicate the driver section of I/O driver/receiver, 300 and the receiver section of I/O driver/receiver 302 are functional. If, however, the two bit patterns input to the XOR gate, 342, don't match, a least one "one" will be output. This may indicate that either the driver section of I/O driver/receiver, 300 or the receiver section of the I/O driver/receiver, 302, is not functional. It may also indicate that both the driver section of the I/O driver/receiver, 300 and the receiver section of I/O driver/receiver, 302, are not functional.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for testing functionality of I/O driver/receivers comprising:
   a) connecting a first pad of a first I/O driver/receiver to a second pad of a second I/O driver/receiver;
   b) generating a first bit pattern at an input of a driver contained in said first I/O driver/receiver;
   c) driving said first bit pattern through said driver of said first I/O driver/receiver to said first pad;
   d) driving said first bit pattern to said second pad and through a receiver in said second I/O driver/receiver;
   e) comparing said first bit pattern driven through said receiver in said second I/O driver/receiver with a generated second bit pattern identical to said first bit pattern.

2. The method as in claim 1 wherein said first and second bit patterns are generated by a bit pattern generator.

3. The method as in claim 1 wherein said first and said second bit patterns are compared comprising:
   a) directing said first bit pattern driven through said receiver in said second I/O driver/receiver into a first clocked register;
   b) directing said second bit pattern into a second clocked register;
   c) directing output of said first clocked register into a first input of a comparator;
   d) directing output of said second clocked register into a second input of a comparator.

4. The method as in claim 3 wherein said comparator is an exclusive OR gate.

5. The method as in claim 3 wherein said comparator is an exclusive NOR gate.

* * * * *